United States Patent
Fensore et al.

(10) Patent No.: US 7,342,427 B1
(45) Date of Patent: Mar. 11, 2008

(54) AUTOMATIC CLOCK BASED POWER-DOWN CIRCUIT

(75) Inventors: David James Fensore, New Gloucester, ME (US); Alexander A. Alexeyev, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 156 days.

(21) Appl. No.: 11/311,782

(22) Filed: Dec. 19, 2005

(51) Int. Cl.
 *H03L 7/06* (2006.01)
(52) U.S. Cl. .................. 327/157; 327/544; 330/1 R
(58) Field of Classification Search .............. None
 See application file for complete search history.

(56) References Cited

U.S. PATENT DOCUMENTS

| | | | | |
|---|---|---|---|---|
| 5,561,390 | A * | 10/1996 | Hiiragizawa | 327/147 |
| 5,870,002 | A * | 2/1999 | Ghaderi et al. | 331/17 |
| 6,111,468 | A * | 8/2000 | Tanishima | 331/17 |
| 6,633,184 | B2 * | 10/2003 | Idei et al. | 327/12 |
| 6,864,729 | B2 * | 3/2005 | Aoki et al. | 327/157 |
| 6,927,635 | B2 * | 8/2005 | Miki et al. | 331/1 A |
| 6,998,889 | B2 * | 2/2006 | Best | 327/157 |
| 2007/0090887 | A1 * | 4/2007 | Seefeldt et al. | 331/17 |

OTHER PUBLICATIONS

National Semiconductor Corporation, "LM2502 Mobile Pixel Link (MPL) Display Interface Serializer and Deserializer" Data Sheet, pp. 1-27, Jan. 2006.

* cited by examiner

*Primary Examiner*—Kenneth B. Wells
*Assistant Examiner*—Terry L Englund
(74) *Attorney, Agent, or Firm*—Darby & Darby P.C.; Davin Chin

(57) ABSTRACT

An apparatus and method for automatically transitioning the operation of an electronic device to a reduced power consumption state if an input reference clock signal is stopped or no longer synchronized (locked) with the operation of the electronic device. The electronic device is automatically returned to a normal operating/power consumption state if the reference clock is restarted. Mixed analog and digital electronic components are employed to handle the transition of the electronic device between reduced and normal power consumption states. These components can include a phase frequency detector and a lost_lock detection circuit. The lost_lock detection circuit is typically connected to the output of phase frequency detector and outputs a lost_lock signal if the reference clock signal has stopped or lost_lock with a feedback clock signal. The lost_lock detection circuit operates on at least one error signal outputted by the phase frequency detector and is relatively insensitive to variations in the duty cycle of the reference and feedback clock signals.

19 Claims, 8 Drawing Sheets

US 7,342,427 B1

AUTOMATIC CLOCK BASED POWER-DOWN CIRCUIT

FIELD OF THE INVENTION

The present invention relates to transitioning the operation of an electronic device to a low power consumption state in response to an input, and more particularly, if an input reference clock is stopped, transitioning the device to the low power state and automatically returning the device to a normal power consumption state if the reference clock is restarted.

BACKGROUND OF THE INVENTION

In the past, some electronic circuits could be configured to transition to a low power consumption state in response to an input signal provided at a dedicated input. This type of electronic circuit could include a Phase Locked Loop circuit (PLL) for multiplying a reference clock signal to a significantly higher frequency. Also, electronic circuits that employed PLL circuits in such a fashion often included a dedicated input to transition the operation of the PLL circuit to a low power consumption state when it was not in use for some predetermined function, e.g., serial data shifting.

DETAILED DESCRIPTION OF THE PREFERRED EMBODIMENT

Figure 1:
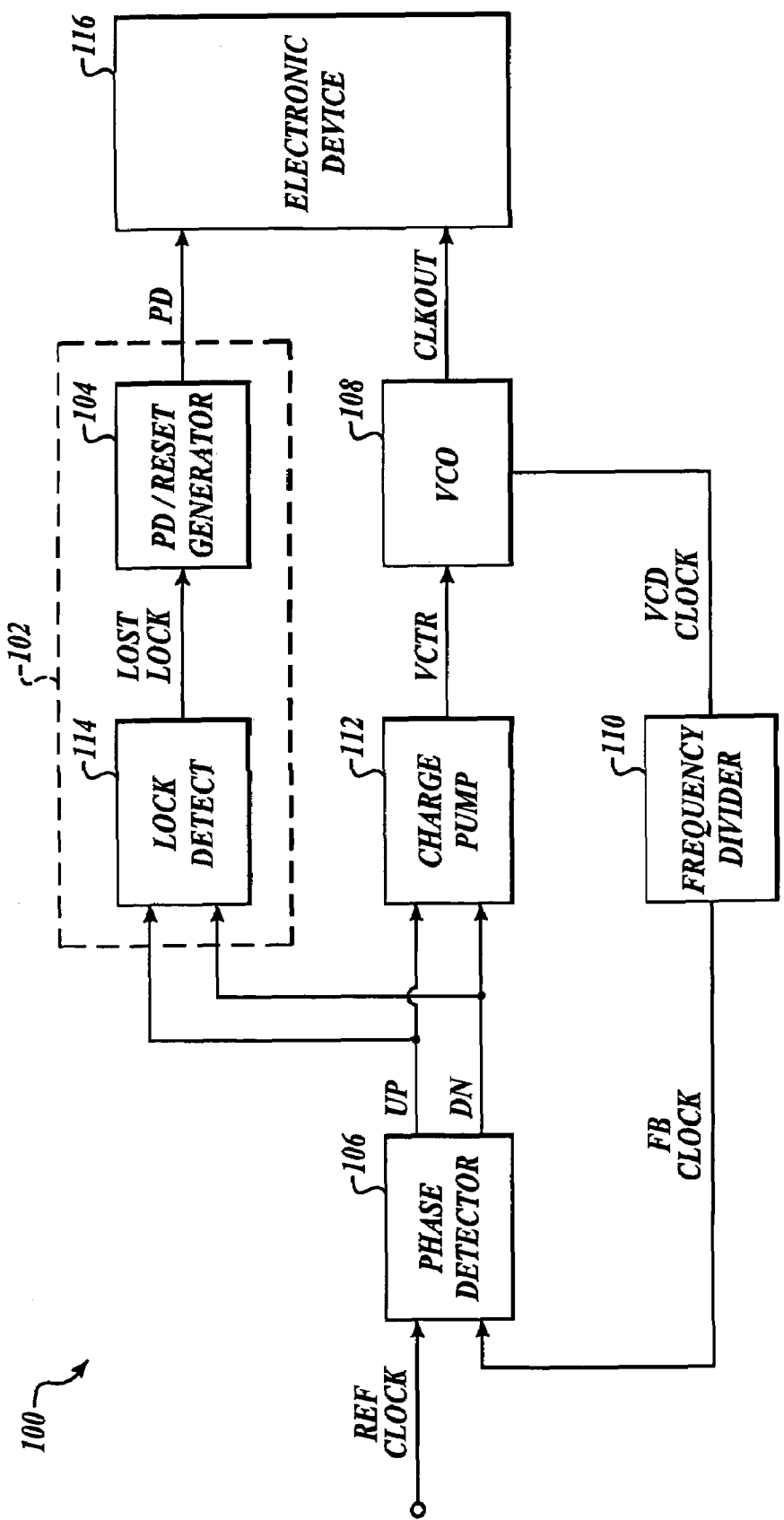
FIG. 1 is a schematic diagram illustrating an exemplary Phase Locked Loop with an automatic lost_lock detection circuit.

The following description is presented to enable any person skilled in the art to make and use the invention, and is provided in the context of particular applications of the invention and their requirements. Various modifications to the disclosed embodiments will be readily apparent to those skilled in the art and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function. Similar reference letters given to resistors and capacitors do not signify that these elements have the same values.

The invention is generally directed to an apparatus and method for automatically transitioning the operation of an electronic device to a reduced power consumption state if an input reference clock signal is stopped or no longer synchronized (locked) with the operation of the electronic device. The electronic device is automatically returned to a normal operating/power consumption state if the reference clock is restarted. Mixed analog and digital electronic components are employed to handle the transition of the electronic device between reduced and normal power consumption states. These components can include a phase frequency detector and a lost_lock detection circuit. The lost_lock detection circuit is typically connected to the output of phase frequency detector and outputs a lost_lock signal if the reference clock signal has stopped or lost_lock with a feedback clock signal. The lost_lock detection circuit operates on at least one error signal outputted by the phase frequency detector and is relatively insensitive to variations in the duty cycle of the reference and feedback clock signals.

In one embodiment, a reference clock signal and a feedback clock signal are inputs to a phase frequency detector which outputs at least one phase-error signal indicating whether the phase of the feedback clock signal leads or lags the phase of the reference clock signal. A power-down/reset signal generator is typically connected to a lock detection circuit for controlling low and normal power consumption states. The generator also generates a reset signal in response to receiving a lost_lock signal. Additionally, the phase frequency detector is usually connected to a voltage controlled oscillator and the at least one phase-error signal is fed back to the phase frequency detector such that it drives the output of the voltage controlled oscillator towards the frequency of the reference clock signal.

FIG. 1 shows a Phase Locked Loop (PLL 100) including lost_lock detection circuit 102 that enables a power-down/reset signal generator 104 to turn off electronic device 116 if the PLL is not "locked" to a reference signal. In one embodiment, lost lock detection circuit 102 can be embedded in a separate module that generates a reset signal and a power down signal for controlling power consumption states of electronic device 116.

Lost_lock detection circuit 102 utilizes the output of a phase frequency detector (PFD 106) of PLL 100 to generate a lost_lock signal. PFD 106 outputs up (UP) and down (DN) pulses (See FIG. 3) which indicate if the phase of the PLL feedback clock signal leads or lags the reference clock phase. The output of PFD 106 is passed to a charge pump 112 and is then fed into a voltage controlled oscillator (VCO) 108. The output of VCO 108 is fed through frequency divider 110 and then back to PFD 106 as a feedback clock signal.

The reference and feedback clock signals are fed as input signals to PFD 106 and differences in their frequency/phase are manifested in a phase-error signal. The phase-error signal is fed back to PFD 106 such that it drives the output of VCO 108 towards the reference clock frequency which enables the VCO to lock onto the reference clock signal's frequency. A frequency divider 110 is included in the feedback loop so that, at lock, VCO 108 can oscillate at a multiple of the reference clock signal's frequency while still maintaining relative stability.

PFD 106 compares the two input frequencies (reference clock and feedback clock), and generates an output that is a measure of their phase difference. Consequently, if the two signals, are equal in phase and frequency, PFD 106 doesn't generate an output signal. However, if the two input signals do differ in frequency, PFD 106 can provide a periodic output signal at the difference of the input signal's frequency.

Referring to FIG. 1, if a frequency of the reference clock signal is not equivalent to a frequency of the feedback clock signal, the phase-error signal output of PFD 106 causes a frequency of VCO 108 to change in the direction of the frequency of the reference clock signal. However, if the frequency of the reference clock signal is equivalent to the frequency of the feedback signal, VCO 108 "locks" to the frequency of the reference clock signal to maintain a relatively fixed relationship to the reference signal, at which point the output of PFD 106 is a Direct Current (DC) signal. The VCO 108 output is a locally generated frequency relatively equivalent to the frequency of the reference clock signal or a multiple thereof, thus VCO 108 provides a relatively clean replica of the frequency of the reference clock signal or provides a clock signal having a frequency that is a multiple of the reference clock signal frequency. The output of VCO 108 can be a triangle wave, square wave or sine wave and PLL 100 can be used to generate and lock such a wave to a train of pulses.

Figure 3:
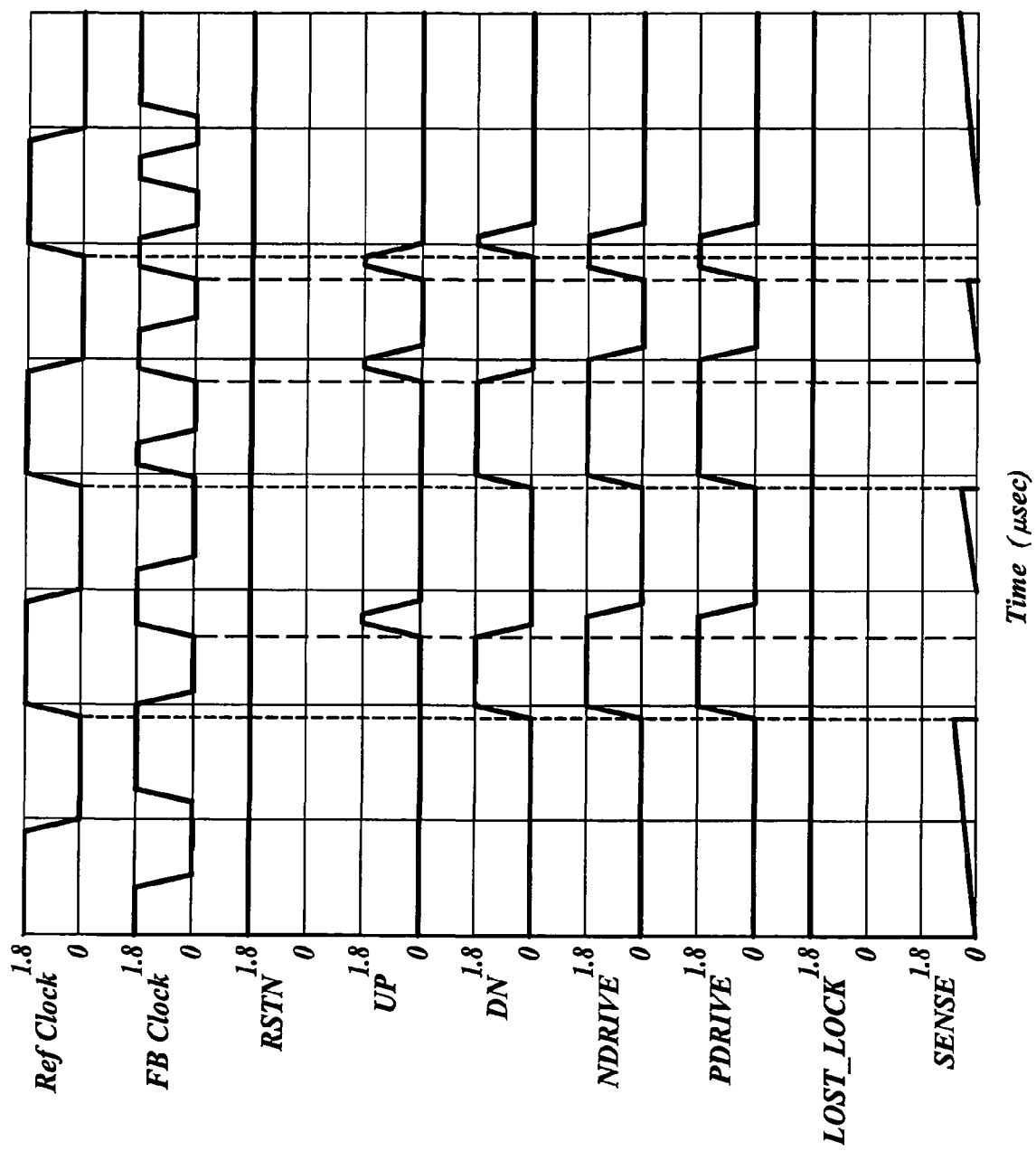
FIGS. 3-7 illustrate timing diagrams illustrating the duty cycle of a Phase Locked Loop feedback clock and the reference clock in relation to the outputs of a Phase Frequency detector and a Lock-in Detector at various stages of operation of a Phase Locked Loop circuit.

Generally, the operation of PFD 106 can be driven by digital transitions and it is sensitive to the relative timing of edges between the reference clock signal and the feedback clock signal as shown in FIG. 3. PFD 106 generates lead (UP) and lag (DN) output pulses, depending on whether the VCO output transitions occur before or after the transitions of the reference clock signal, respectively. The width of these pulses is relatively equivalent to the time between the respective edges. The output circuitry then sinks or sources current during those pulses and is otherwise open-circuited generating an average output-voltage-versus-phase difference. This operation is relatively independent of the duty cycle of the input signals. Furthermore, the UP and DN output pulses are not produced if the two signals are "locked". In this way, there is relatively no "ripple" present at the output to generate periodic phase modulation in PLL 100.

PFD 106 generates output pulses if there is a phase error between the reference and VCO signal at the output of frequency divider 110. Since the phase detector output otherwise looks like an open circuit, a loop filter capacitor can act as a voltage-storage device, holding the voltage that supports the appropriate frequency for VCO 108. If the reference signal moves away in frequency, the phase detector generates a train of short pulses, charging (or discharging) the capacitor to the new voltage needed to put VCO 108 back into a "locked" mode.

At the end of each phase comparison cycle, PFD 106 produces short reset pulses that reset charge pump 112 to remove the leakage charge. These reset pulses return PFD 106 outputs to the default state in expectation of the next rising edge of the input clock or feedback clock, whichever comes first. If the input clock is stopped, no reset pulses are produced and VCO 108 runs in an open loop mode. Lock detect circuit 114 recognizes this condition and generates a lost_lock signal which in turn triggers power down/reset generator 104 to put PLL 100 in a power-down mode. Later, when the input clock is restarted, a synchronous reset signal from generator 104 is provided to release PLL 100 from its power down mode so that it can "lock" again to the input clock.

Figure 2:
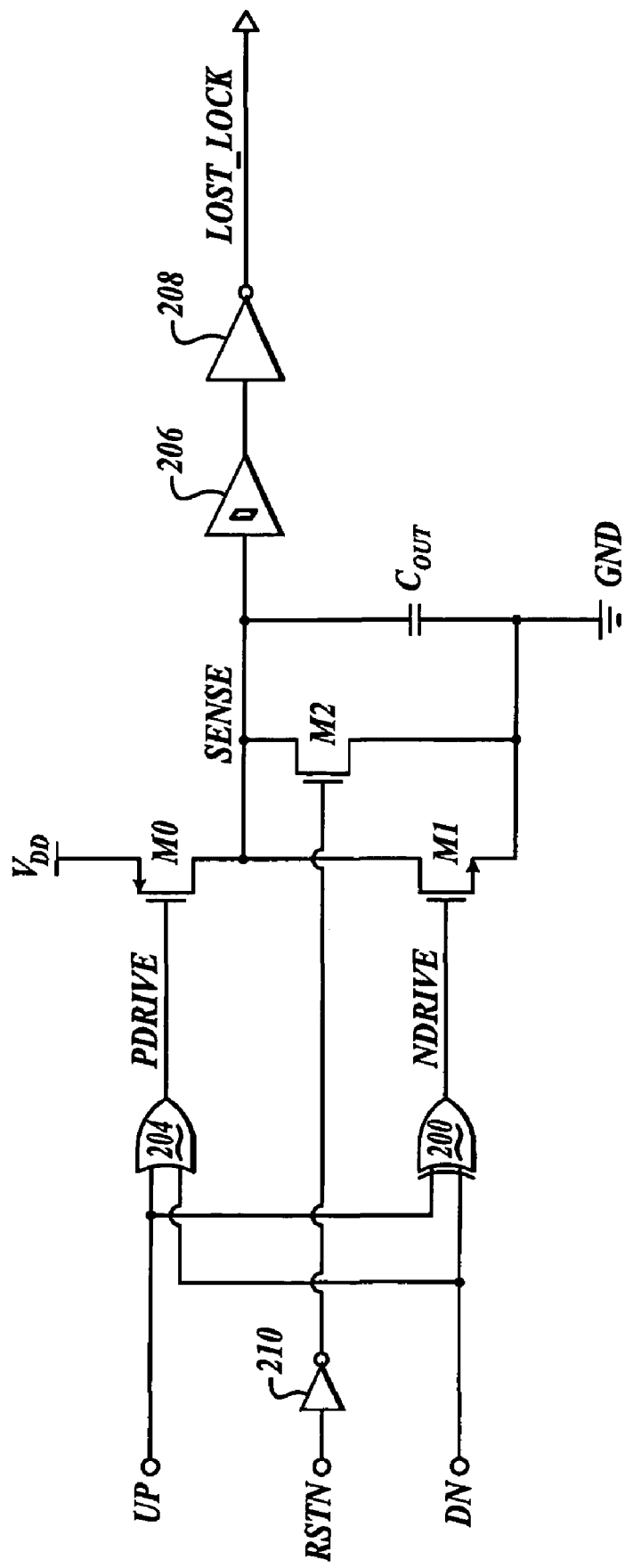
FIG. 2 is a schematic diagram illustrating an automatic lost_lock detection circuit.

FIG. 2 is a schematic diagram illustrating one possible configuration for Lock Detect circuit 114, which is configured to operate as follows. Since PFD 106 doesn't output the UP or DN pulses when the operation of PLL 100 is locked to the reference clock input, logical low signals are presented at the inputs of both OR gate 204 and XOR 200. In response, XOR gate 200 drives/produces a logical LOW signal at the gate of the NMOS transistor (M1), which causes M1 to open (stop conducting). Also, in response to the logical low signals at its inputs, OR gate 204 produces/drives a logical LOW output at the gate of PMOS transistor (M0), which causes M0 to close (conduct) for the period of the PLL's reference clock signal (except during the charge pump's reset pulse, as discussed above for FIG. 1). In this manner, the capacitor (Cout) is coupled between ground and the supply voltage (VDD) through the SENSE node that is coupled to PMOS M0.

However, PLL 100 can subsequently lose its "lock" on the reference clock signal's frequency for a variety of reasons, such as an instantaneous change in the reference clock frequency, stopping of the reference clock, or noise that affects the timing relationship between the reference clock signal and the feedback clock signal. When PLL 100 loses its lock, XOR gate 200 starts producing/driving logically high pulses at the gate of NMOS gate M1 so that it remains closed for a duration of time proportional to the phase difference between the reference clock signal and feedback clock signal. Selection of the appropriate NMOS and PMOS transistors (M1 and M0 respectively), as well as capacitor Cout, enables lock detect circuit 114 to generate a lost_lock signal that is sensitive to relatively instantaneous changes in reference clock frequency. For example, the geometries of NMOS transistor M1 and PMOS transistor M0, as well as the capacitance of capacitor Cout can be designed to define the rising and falling slopes of voltage at node SENSE. Also, lock detect circuit 114 reflects locking behavior by deactivating itself during a period of time that PLL 100 is "locked". In one embodiment, signal LOST LOCK is provided via inverter 208 and Schmitt trigger 206 based upon the voltage at node SENSE.

Rather than operating on the reference clock signal and PLL feedback clock signal, the operation of automatic lost_lock detection circuit 102 is substantially based on the UP and DN pulses outputted by PFD 106. Consequently, the operation of circuit 102 is relatively insensitive to variations in the duty cycles of the reference clock signal and feedback clock signal. Accordingly, lost_lock detection circuit 102 can provide a relatively accurate, real time observation of the PLL's state of operation that is relatively independent of duty cycle, which further eases the design of PLLs and reference clock circuits that are employed with the invention.

When PLL 100 loses its "lock" due to an instantaneous change in the reference clock signal's frequency, stopping of the reference clock, or noise that affects the timing relationship between the reference and feedback clock signals, lock detect circuit 114 can almost immediately detect this condition and provide a lost_lock signal to power-down/reset generator 104. In response to the lost_lock signal, power-down generator 114 outputs a power-down signal that can be employed to transition the operation of the electronic device to a state of relatively low power consumption. This power-down state can be maintained until a wakeup condition is encountered. In one embodiment, this wake-up condition is signaled by the restarting of the reference clock signal.

In addition, in one embodiment, inverter 210 is arranged to invert active-low reset signal RSTN to drive the gate of transistor M2. Transistor M2 is arranged to discharge capacitor Cout while reset signal RSTN is low.

FIGS. 3-7 are timing diagrams illustrating the duty cycle of the feedback and reference clock signals in relation to the outputs of the PFD 106 and the Lock Detect circuit 114. FIG. 3 is a timing diagram representing an OUT-OF-LOCK state. While FIG. 3 shows the feedback clock phase leading the reference clock phase, this diagram is for exemplary purposes and the feedback clock could have be shown lagging the reference clock phase just as well. As explained above and shown graphically in FIG. 3, during an OUT-OF-LOCK state the sense node is held low by the discharging of capacitor Cout during which time the lost_lock signal remains high.

Figure 4:
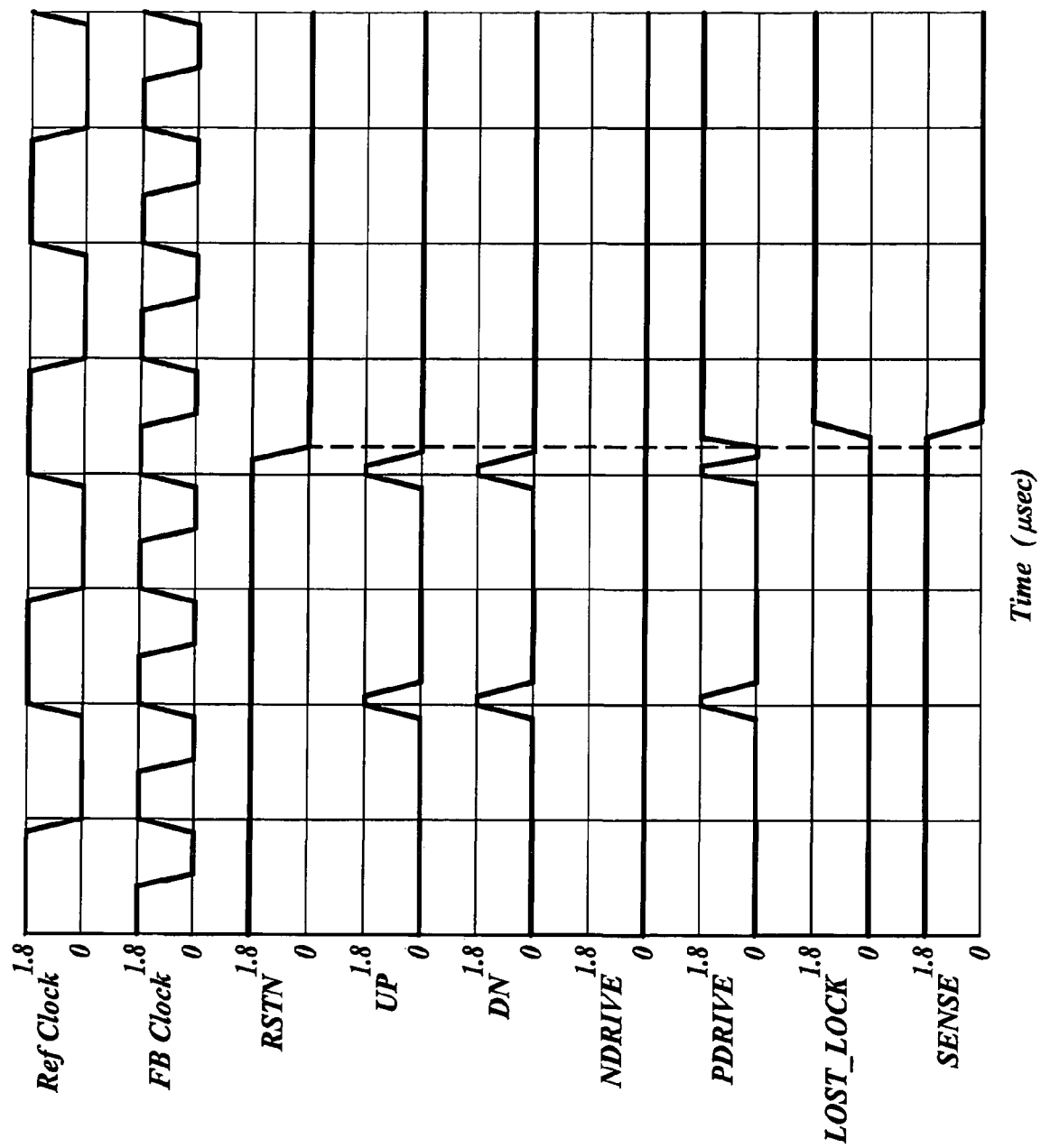

FIG. 4 is a timing diagram illustrating the PLL being reset by an externally applied reset signal RSTN (e.g., FIG. 2), which forces the operation of PLL into the power down/low power consumption state. When the reset signal RSTN is driven low, the PDRIVE signal at the gate of M0 is driven high, and the voltage at the sense node drops to zero. This causes the lost_lock signal to go high, which initiates the power down state for the electronic device.

Figure 5:
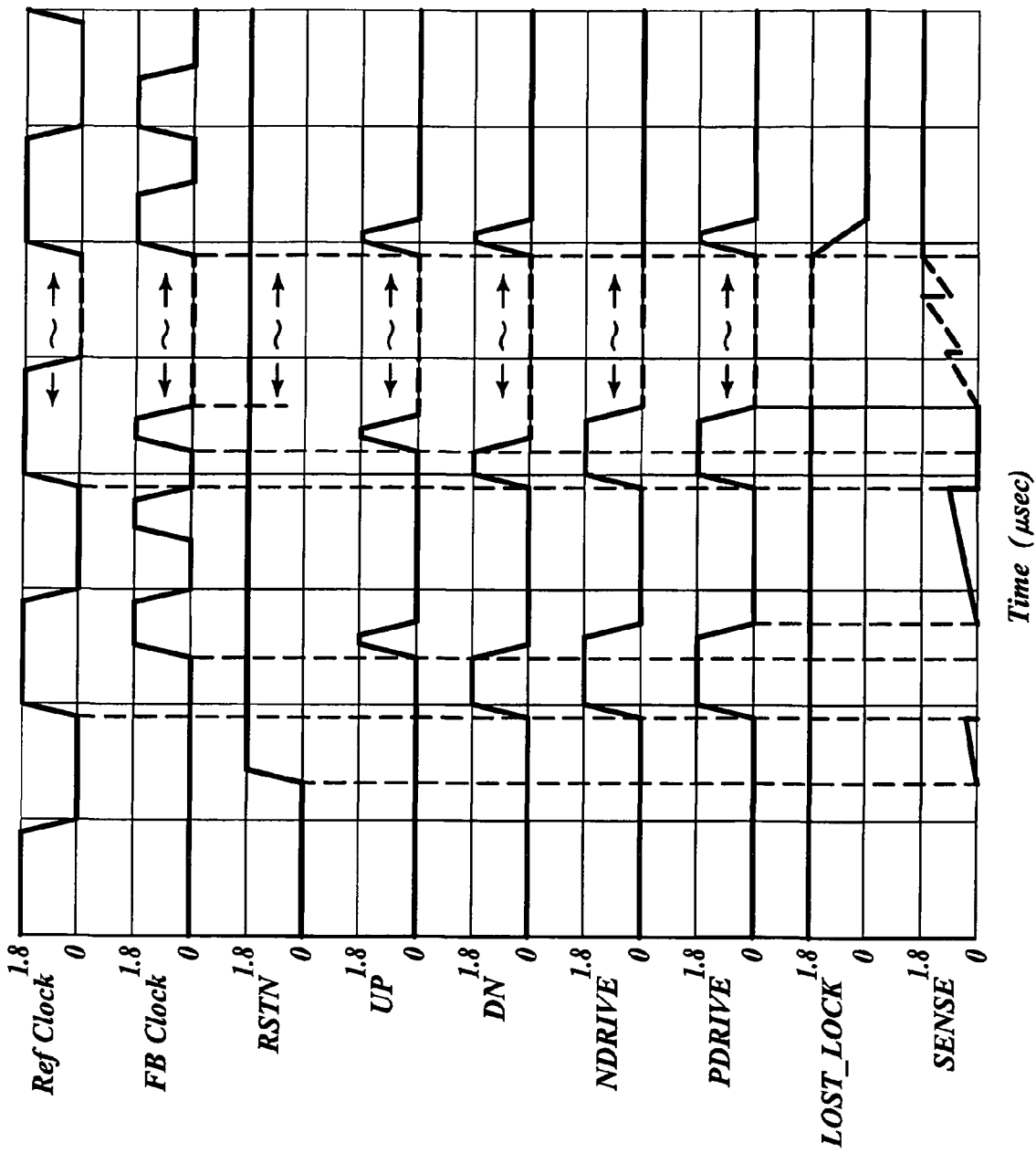

However, once the reset signal RSTN of FIG. 4 is removed, the PLL signal can relock as illustrated in FIG. 5. Referring to FIG. 5, as the sense node goes high, the lost_lock signal drops low and the PLL relocks.

Figure 6:
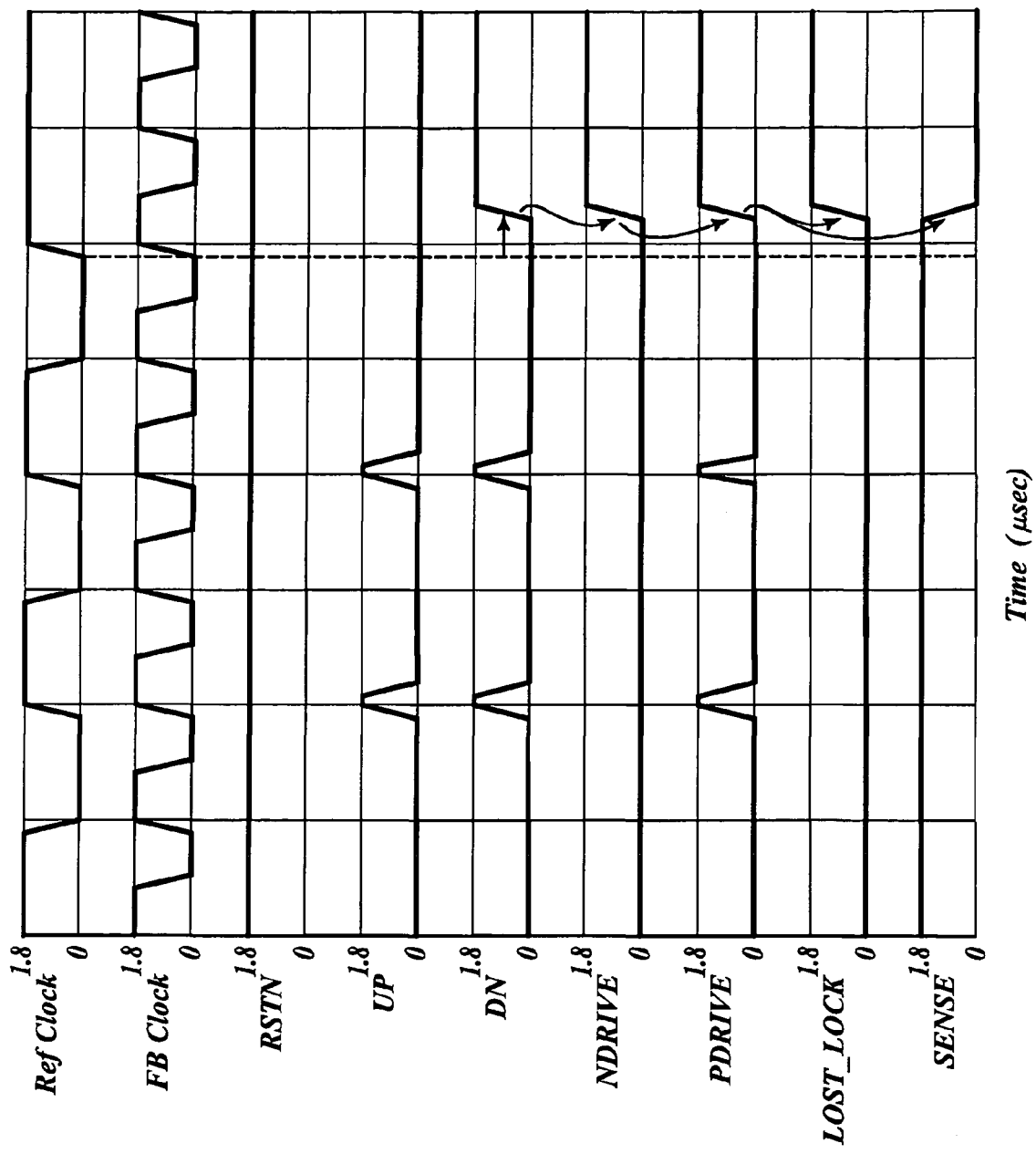

FIG. 6 is an exemplary timing diagram representing a STOPPED state, where the reference clock signal has stopped. The PFD 106 outputs (UP and DN outputs) are static after stoppage of the reference clock is detected, effectively putting PLL 100 in an open loop mode of operation. However, after stoppage of the reference clock is detected, the polarity of the UP and DN signals is such that OR gate 204 drives signal PDRIVE high and XOR gate 200 drives signal NDRIVE high. Thus, capacitor Cout is discharged and the voltage at the sense node transitions to a logic low level and causes the lost_lock signal to be driven high. The lost_lock signal is used to trigger the power down sequence for the electronic device. The lost_lock signal goes high after the reference clock signal is stopped indicating that the lock is lost. The lost_lock signal stays high (e.g., static) until PLL 100 relocks.

Figure 7:
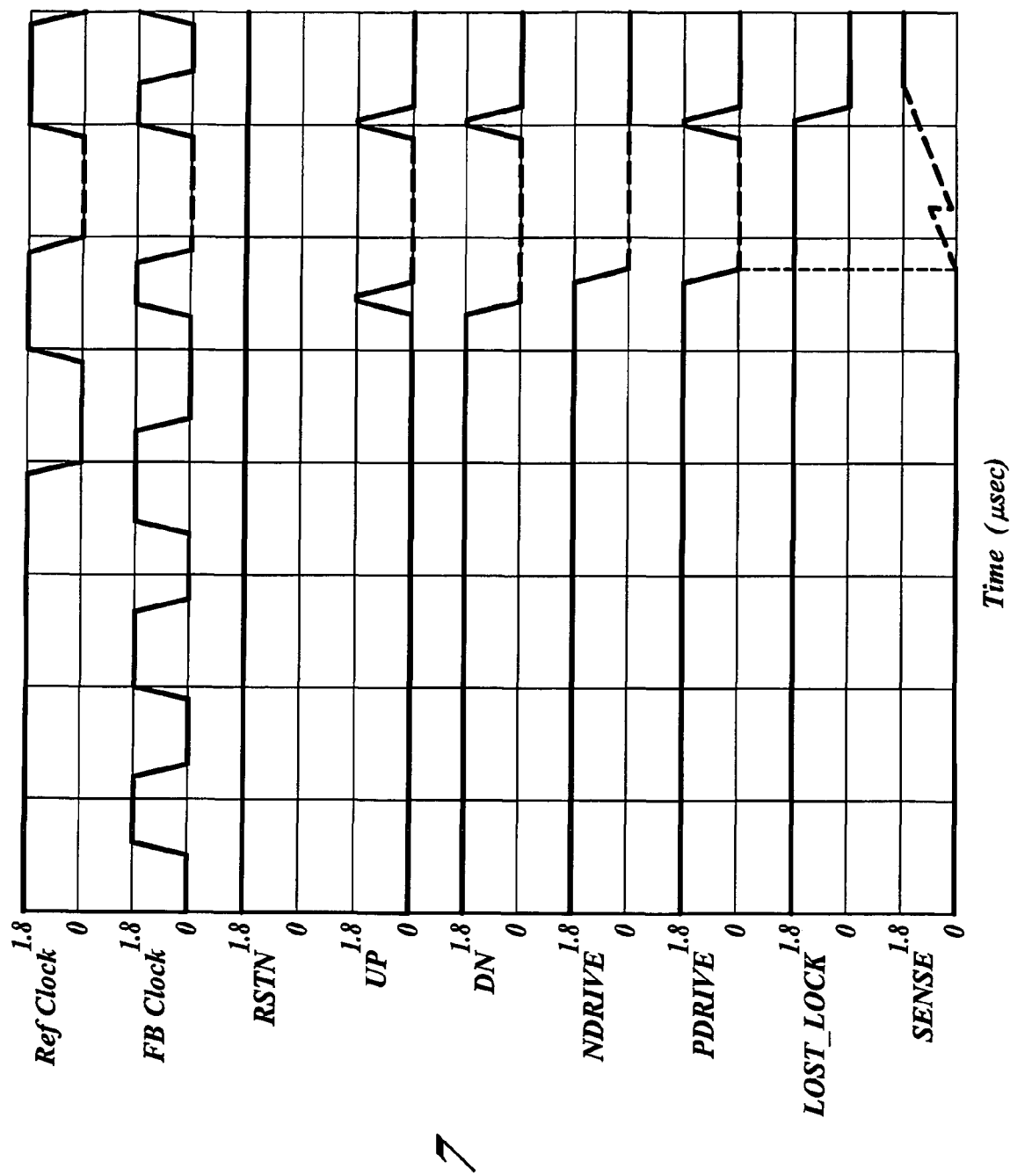

FIG. 7 is an exemplary timing diagram that illustrates restarting the reference clock signal in which the PLL reacquires lock. Once the lock detector detects the power-down condition, the power-down state is maintained until a wakeup condition is encountered, i.e., the power down reset signal (RSTN). This wake-up condition can be signaled by restarting the reference clock as shown. Regardless of the mechanism of generation for the lost_lock signal, the lock detect circuit operates on the PLL in the locked mode of operation.

However, the lost_lock detection circuit of (102 in FIG. 1) is typically employed to detect the loss of the reference clock signal and automatically transition an electronic device to a low power consumption state. When the reference clock is subsequently restarted, the electronic device is brought back to a relatively normal operating condition.

Figure 8:
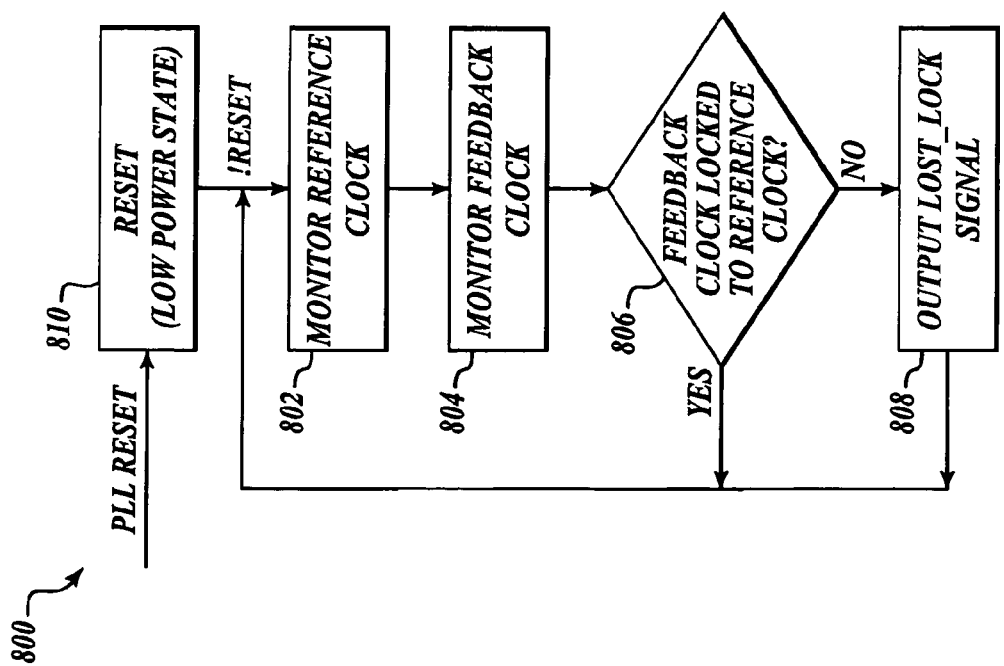
FIG. 8 shows a flow diagram for a process to detect a lost_lock condition in an electronic device.

FIG. 8 illustrates an overview of process 800 for providing a lost_lock signal that is independent of the duty cycles of a reference clock signal and feedback clock signal. Starting with block 802, the frequency of the reference clock signal is monitored. At block 804, the frequency of a feedback clock signal is also monitored. Stepping to decision block 806, a determination is made as to whether the feedback clock signal is locked to the reference clock signal. If true, the process clears the lost_lock signal if set and jumps back to block 802 where it repeats substantially the same actions as discussed above.

However, if the determination at decision block 806 is false indicating that the feedback clock has lost_lock with the reference clock for any one of the above described reasons, the process advances to block 808 where a lost_lock signal is outputted. The process then jumps back to block 802 and repeats substantially the same actions as discussed above. If PLL reset is asserted, the process advances to block 810 where it remains until the PLL reset is released. Therefore, until the PLL reset is asserted at block 810, the PLL is in a continuous loop of evaluating the conditions at blocks 802, 804, 806 and 808.

Figure 9:
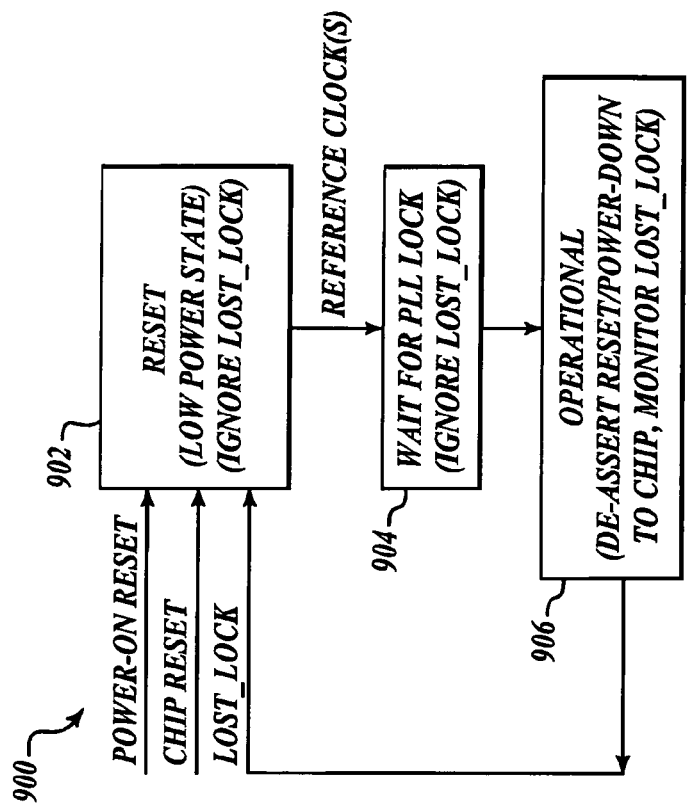
FIG. 9 shows a flow diagram for a process to detect PLL lock after an electronic device has been placed in a low power state, in accordance with the invention.

FIG. 9 illustrates an overview of process 900 for controlling the power down state. Starting with block 902, N reference clock pluses are counted to determine if it is appropriate to transition from the low power state to the high power state.

At block 904, the lost_lock signal is ignored as the PLL waits for lock between the reference clock frequency and the feedback clock frequency. Once PLL lock occurs, the process transitions to block 906 where the lost_lock signal is monitored, and the reset and power down signals to the integrated circuit are de-asserted. From block 906, the detection of the lost_lock signal again causes the process to return to the actions performed at block 902.

Additionally, the lost_lock signal can be employed to trigger a reduced power consumption state in an electronic circuit without having to provide a separate terminal for such functionality. The invention can be used to simplify the implementation of power saving states since it does not require a dedicated terminal to achieve the above described reduced power consumption function. Also, the logical operation described above can be used to reset the device automatically if the reference clock signal changes.

It will be understood that each block of the above flowchart illustrations, and combinations of blocks in the flowchart illustrations, can be implemented by computer program instructions. These program instructions may be provided to a processor to produce a machine, such that the instructions, which execute on the processor, create means for implementing the actions specified in the flowchart block or blocks. The computer program instructions may be executed by a processor to cause a series of operational steps to be performed by the processor to produce a computer implemented process such that the instructions, which execute on the processor to provide steps for implementing the actions specified in the flowchart block or blocks.

Accordingly, blocks of the flowchart illustrations support combinations of means for performing the specified actions, combinations of steps for performing the specified actions and program instruction means for performing the specified actions. It will also be understood that each block of the flowchart illustration, and combinations of blocks in the flowchart illustration, can be implemented by special purpose hardware-based systems which perform the specified actions or steps, or combinations of special purpose hardware and computer instructions.

The above specification, examples, and data provide a complete description of the manufacture and use of the composition of the invention. Since many embodiments of the invention can be made without departing from the spirit and scope of the invention, the invention resides in the claims hereinafter appended.

We claim:

1. An apparatus for enabling different power consumption states for an electronic device, comprising:
a phase frequency detector that is arranged to receive a reference clock signal and a feedback clock signal, and is further arranged to output at least one error signal if a phase of the feedback clock signal lags or leads another phase of the reference clock signal; and
a lost_lock detection circuit that is arranged to output a lost_lock signal based on receiving the at least one error signal, wherein the lost_lock signal is provided to the electronic device to enable a transition to a reduced power consumption state, wherein the at least one error signal includes a down logic signal and an up logic signal, and wherein the lost_lock detection circuit comprises:
an OR logic device and an XOR logic device, wherein the down logic signal and the up logic signal are provided as inputs to both the OR and XOR logic devices, wherein the up and down logic signals are based on a lagging or leading indicated by the at least one error signal for the phases of the reference clock signal and feedback clock signal;
a PMOS transistor coupled to the output of the OR logic device; and
an NMOS transistor coupled to the output of the XOR logic device, wherein the arrangement of the PMOS and NMOS transistors are configured to share a common drain connection.

2. The apparatus of claim 1, further comprising a generator that is arranged to provide a power down signal to the electronic device based at least in part on the lost_lock signal.

3. The apparatus of claim 2, wherein the lost_lock detection circuit is arranged to receive a reset signal to enable a transition from the reduced power consumption state to a higher power consumption state for the electronic device.

4. The apparatus of claim 1, wherein if the reference clock signal is unavailable, the lost_lock detection circuit outputs the lost_lock signal.

5. The apparatus of claim 1, wherein the operation of the lost_lock detection circuit is relatively independent of a duty cycle of the reference clock signal or another duty cycle of the feedback clock signal.

6. The apparatus of claim 1, wherein the XOR logic device produces a sequence of pulses that keep the NMOS transistor closed for a duration of time proportional to a phase difference between the reference clock signal and the feedback clock signal.

7. The apparatus of claim 1, wherein the NMOS and PMOS transistors are sized such that the lost_lock signal is relatively independent of instantaneous changes in a frequency or a phase of the reference clock signal.

8. The apparatus of claim 1, further comprising a voltage controlled oscillator that is coupled to the phase frequency detector, wherein the feedback clock is fed back to the phase frequency detector such that it drives the output of the voltage controlled oscillator towards the frequency of the reference clock signal.

9. The apparatus of claim 1, wherein at least one of the at least one error signal is a periodic output that is related to a difference between a frequency of the reference clock signal and another frequency of the feedback clock signal.

10. The apparatus of claim 1, wherein a frequency of the feedback clock signal is evenly divisible by another frequency of the reference clock signal.

11. The apparatus of claim 1, further comprising:
a charge pump that is coupled to the phase frequency detector; and
a voltage controlled oscillator that receives the at least one error signal that is fed by the phase frequency detector through the charge pump.

12. A method for enabling different power consumption states for an electronic device, comprising:
monitoring a reference clock signal;
monitoring a feedback clock signal;
providing a down logic signal and an up logic signal based, at least in part, on the monitoring of the reference clock signal and the monitoring of the feedback clock signal;
employing an OR logic device and an XOR logic device to respectively provide a first control signal and a second control signal, wherein the down logic signal and the up logic signal are provided as inputs to both the OR and XOR logic devices, and wherein the up and down logic signals are based on a lagging or a leading of phases of the reference clock signal and of the feedback clock signal;
employing a PMOS transistor to selectively couple the sense node to an input voltage while the first control signal is low;
employing an NMOS transistor to selectively couple a sense node to a ground node while the second control signal is high, wherein the arrangement of the PMOS and NMOS transistors are configured to share a common drain connection;
providing a lost_lock signal based, at least in part, on a voltage at the sense node;
employing the lost_lock signal to enable the electronic device to transition to a reduced power consumption state.

13. The method of claim 12, further comprising if the reference clock signal is unavailable, providing the lost_lock signal.

14. The method of claim 13, further comprising providing a reset condition if the reference clock signal is restarted.

15. The method of claim 12, providing a power down signal in response to the lost_lock signal, wherein the power down signal is employed to reduce the power consumption in the electronic device.

16. The method of claim 12, further comprising if the reference clock signal and the feedback clock signal have at least one of a different frequency or phase, the feedback clock signal is unlocked to the reference clock signal.

17. The method of claim 12, wherein the lost_lock signal is independent of a variation in a duty cycle for the reference clock signal or another duty cycle for the feedback clock signal.

18. A circuit that enables different power consumption states, comprising:
a phase frequency detector that is arranged to receive a reference clock signal and a feedback clock signal from a phase locked loop circuit, and is further arranged to output at least one error signal if at least a phase of the feedback clock signal lags or leads a phase of the reference clock signal; and
a lost_lock detection circuit that is arranged to output a lost_lock signal based on receiving the at least one error signal, wherein the lost_lock signal is provided to a power down generator that transitions the circuit to a reduced power consumption state wherein the at least one error signal includes a down logic signal and an up logic signal, and wherein the lost_lock detection circuit comprises:

an OR logic device and an XOR logic device, wherein the down logic signal and the up logic signal are provided as inputs to both the OR and XOR logic devices, wherein the up and down logic signals are based on a lagging or leading indicated by the at least one error signal for the phases of the reference clock signal and feedback clock signal;

a PMOS transistor coupled to the output of the OR logic device; and an NMOS transistor coupled to the output of the XOR logic device, wherein the arrangement of the PMOS and NMOS transistors are configured to share a common drain connection.

19. The circuit of claim 18, wherein at least one of the at least one error signal is a periodic output that is related to a difference between a frequency of the reference clock signal and another frequency of the feedback clock signal.

\* \* \* \* \*

UNITED STATES PATENT AND TRADEMARK OFFICE
CERTIFICATE OF CORRECTION

PATENT NO.        : 7,342,427 B1                                          Page 1 of 1
APPLICATION NO.   : 11/311782
DATED             : March 11, 2008
INVENTOR(S)       : Fensore et al.

It is certified that error appears in the above-identified patent and that said Letters Patent is hereby corrected as shown below:

In column 2, line 42, delete "lost lock" and insert -- lost_lock --, therefor.

In column 4, line 40, delete "LOST LOCK" and insert -- LOST_LOCK --, therefor.

In column 8, line 24, in Claim 12, delete "the" and insert -- a --, therefor.

In column 8, line 27, in Claim 12, delete "a" and insert -- the --, therefor.

In column 8, line 33, in Claim 12, after "node;" insert -- and --.

In column 8, line 67, in Claim 18, after "state" insert -- , --.

Signed and Sealed this

Eighth Day of July, 2008

JON W. DUDAS
*Director of the United States Patent and Trademark Office*